United States Patent
Otsuka et al.

(10) Patent No.: US 9,293,196 B2
(45) Date of Patent: Mar. 22, 2016

(54) MEMORY CELLS, MEMORY SYSTEMS, AND MEMORY PROGRAMMING METHODS

(71) Applicant: Micron Technology, Inc., Boise, ID (US)

(72) Inventors: Wataru Otsuka, Boise, ID (US); Takafumi Kunihiro, Boise, ID (US); Tomohito Tsushima, Boise, ID (US); Makoto Kitigawa, Folsom, CA (US); Jun Sumino, Boise, ID (US); D. V. Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 13/837,911

(22) Filed: Mar. 15, 2013

(65) Prior Publication Data

US 2014/0268992 A1 Sep. 18, 2014

(51) Int. Cl.
*G11C 11/00* (2006.01)
*G11C 13/00* (2006.01)
*H01L 45/00* (2006.01)

(52) U.S. Cl.
CPC ........ *G11C 13/0002* (2013.01); *G11C 13/0011* (2013.01); *G11C 13/0069* (2013.01); *H01L 45/085* (2013.01); *H01L 45/1233* (2013.01); *H01L 45/1266* (2013.01); *H01L 45/146* (2013.01); *G11C 2013/0073* (2013.01); *G11C 2013/0083* (2013.01); *G11C 2213/56* (2013.01); *G11C 2213/79* (2013.01)

(58) Field of Classification Search
CPC .................. G11C 13/0009; G11C 2213/56
USPC ............................................ 365/148; 257/49
See application file for complete search history.

(56) References Cited

U.S. PATENT DOCUMENTS

| | | | | |
|---|---|---|---|---|
| 5,761,115 A * | 6/1998 | Kozicki et al. | ............... | 365/182 |
| 6,044,012 A * | 3/2000 | Rao et al. | ............... | 365/182 |
| 6,985,378 B2 * | 1/2006 | Kozicki | ............... | 365/153 |
| 7,337,282 B2 * | 2/2008 | Happ et al. | ............... | 711/154 |
| 7,675,766 B2 * | 3/2010 | Kozicki | ............... | 365/148 |

(Continued)

FOREIGN PATENT DOCUMENTS

EP 1727151 A1 * 11/2006 ............. G11C 16/02

OTHER PUBLICATIONS

Peng et al., Nanoscale Research Letters 2012, 7:559.*

(Continued)

*Primary Examiner* — Son Mai
(74) *Attorney, Agent, or Firm* — Wells St. John P.S.

(57) ABSTRACT

Memory cells, memory systems and methods are described. In one embodiment, a memory cell includes electrodes and a memory element, and a first electrically conductive structure is formed within dielectric material providing the memory element in a low resistance state as a result of a first voltage of a first polarity being applied across the electrodes. Additionally, the first electrically conductive structure is removed from the dielectric material providing the memory element in a high resistance state as a result of a second voltage of a second polarity, which is opposite to the first polarity, being applied across the electrodes. A permanent and irreversible electrically conductive structure is formed within the dielectric material providing the memory element in the low resistance state as a result of a third voltage of the second polarity and having an increased potential compared with the second voltage being applied across the electrodes.

38 Claims, 4 Drawing Sheets

(56) References Cited

U.S. PATENT DOCUMENTS

| | | | |
|---|---|---|---|
| 8,331,128 B1* | 12/2012 | Derhacobian et al. | 365/148 |
| 8,957,399 B2* | 2/2015 | Wei | G11C 11/5685 257/2 |
| 2006/0265548 A1* | 11/2006 | Symanczyk et al. | 711/106 |
| 2007/0274120 A1* | 11/2007 | Pinnow et al. | 365/148 |
| 2008/0253167 A1* | 10/2008 | Symanczyk | 365/148 |
| 2008/0273370 A1* | 11/2008 | Keller et al. | 365/148 |
| 2008/0310211 A1* | 12/2008 | Toda et al. | 365/148 |
| 2010/0123542 A1* | 5/2010 | Vaithyanathan et al. | 338/20 |
| 2013/0021835 A1* | 1/2013 | Hwang | G11C 13/0002 365/148 |
| 2013/0188414 A1* | 7/2013 | Kawai | G11C 13/0069 365/148 |

OTHER PUBLICATIONS

Peng et al., Nanoscale Research Letters, 2012, 7:559.*
Aratani et al., IEDM Tech. Dig., 2007, pp. 783-786.*
N. Gilbert, et al., IEEE J. of Solid State Circuits, vol. 42, 2007, p. 1383.*
Tan et al., Wafer Level 3-D ICs Process Technology, Springer, 2008.*
Wong, Time dependent dielectric breakdown in copper low-k interconnects: mechanisms and reliability models, Materials, 2012, 5, 1602-1625.*

* cited by examiner

MEMORY CELLS, MEMORY SYSTEMS, AND MEMORY PROGRAMMING METHODS

TECHNICAL FIELD

Embodiments disclosed herein pertain to memory cells, memory systems and memory programming methods.

BACKGROUND

Memory may include one-time programmable memory cells for use for various purposes. In one example conventional memory arrangement, one memory structure is provided as working memory for writing/reading data while a separate memory structure is provided for storing one-time programmable data which is not changed.

In illustrative implementations, one-time programmable memory may be programmed by a manufacturer of the memory or perhaps an end user customer who incorporates the memory into an end product. The one-time programmable memory is written to once and may be implemented as non-volatile memory, such as fuses or anti-fuses, to permanently store the one-time programmable data.

At least some embodiments described below are directed towards memories, memory arrays, memory systems and memory programming methods.

DETAILED DESCRIPTION OF THE EXAMPLE EMBODIMENTS

At least some embodiments are directed towards apparatus and methods to store data which is not to be changed from its originally-programmed state after the original programming of the memory. In some embodiments described herein, a memory system is provided which includes a plurality of memory cells which are configured to store data. Some memory cells may be utilized as main memory and one or more of the memory cells may be utilized as one-time programmed memory.

Main memory may include a plurality of main cells that are accessible to an end user where the end user is authorized to change the contents of the main memory. The one-time programmed memory may include one or more one-time programmed cells where the end user may not be authorized to change the data after it has been programmed into the one-time programmed memory. As described below in one embodiment, one or more one-time programmed cells may be permanently and irreversibly programmed to only one of a plurality of different memory states. In some embodiments, a common memory structure, such as a memory array, has a plurality of memory cells having a common structure. Some of the memory cells of the memory structure may be utilized as main memory while one or more other memory cells may be utilized as one-time programmed cells to permanently store data in at least one embodiment. Other illustrative embodiments are described below.

Figure 1:
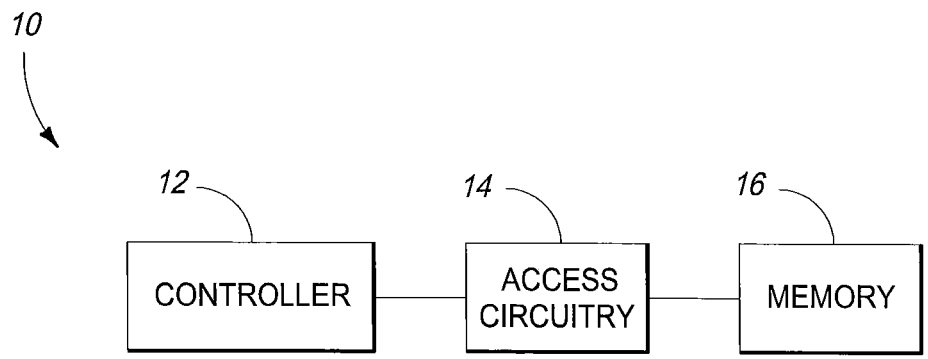
FIG. 1 is a functional block diagram of a memory system according to one embodiment.

Referring to FIG. 1, a functional block diagram of a memory system 10 is shown according to one embodiment. The illustrated memory system 10 includes a controller 12, access circuitry 14, and memory 16. In some embodiments, access circuitry 14 can be located with the controller 12, in memory 16 or upon a separate die from both. In one more specific embodiment, access circuitry 14 could be a bottom die with a stack of memory devices above it. Other embodiments of memory system 10 are possible and may include more, less and/or alternative components or circuitry.

Memory system 10 may be implemented within or with respect to various associated devices (not shown), such as computers, cameras, media players, and thumb drives, in some examples. Memory system 10 stores data generated or utilized by the associated devices in the described examples.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of program (set) and erase (reset) pulses which are applied to memory 16 in one embodiment. The program and erase pulses are used to write data to memory (i.e., program the memory) in one embodiment, and the application of a program pulse and the application of a erase pulse are both referred to as write operations of memory in one embodiment. Other types of pulses may be utilized for programming in other embodiments. Controller 12 may also control the application of read and verify pulses to memory 16 to read and verify stored data in one embodiment.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. In one embodiment, firmware of the controller 12 is stored in one-time programmed memory. For example, the controller 12 may be implemented as one or more processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of memory 16), writing, reading, verifying and re-writing operations with respect to memory cells of memory 16 in one embodiment. For example, access circuitry 14 may receive instructions from controller 12 to select a specific page, word or byte of the memory 16 as well as to implement writing, reading, verifying and re-writing with respect to a plurality of cells of the selected page, word or byte. As discussed below, the access circuitry 14 may apply electrical signals or pulses to the memory 16 to perform write, read and verification operations in one embodiment.

Memory 16 includes a plurality of memory cells configured to store data, conductors electrically connected with the memory cells, and perhaps additional circuitry. At least some of the memory cells are individually capable of being programmed to a plurality of different memory states at a plurality of moments in time. As described in further detail below, some of the memory cells may be utilized as main memory cells having different memory states to store different data at different moments in time and one or more other memory cells may be utilized as one-time programmed memory cells which are individually permanently and irreversibly programmed to one of a plurality of different memory states.

In one embodiment, memory 16 includes one portion which may be referred to as main memory and another portion which may include one-time programmed memory. In one embodiment, the main memory is a first storage location, or main block/array, of a plurality of main memory cells that are accessible to the user and/or associated device where the user and/or associated device are authorized to change the contents of the main memory. In one embodiment, the one-time programmed memory is a second storage location, or secondary block/array, of a plurality of one-time programmed memory cells where the user is not authorized to change the data once it is programmed into the one-time programmed memory. The one-time programmed memory is not programmed by a user in one embodiment, but rather may be programmed by a manufacturer of memory 16, a manufacturer of an associated device which utilizes the memory 16, and/or another entity in illustrative examples. One-time programmed data may include a manufacturer identifier, serial number, redundant information, firmware to control a memory system, or other information. Alternatively, a user may program the one-time programmed memory in one embodiment. In one embodiment, the programming of the one-time programmed memory is permanent and irreversible and the one-time programmed memory cells permanently store data once programmed in one embodiment.

The memory cells may be configured as non-volatile cells in some implementations, and in one specific implementation, the memory cells are resistive random access memory (RRAM) non-volatile cells. As described further below, if the memory is implemented as RRAM, then the memory cells have different resistances corresponding to different memory states (e.g., the different memory states correspond to stored binary 1s and 0s data or perhaps additional states). In one more specific embodiment, memory is implemented as conductive bridge RAM (CBRAM).

As described above, the main memory is available to store data during operations of an associated device (e.g., storing image files generated by an imaging system of an associated device in but one example). Data stored within main memory may be referred to as main data. The main memory cells may be programmed to different states to store different main data at different moments in time in some embodiments. In a more specific embodiment, main memory may be implemented as multiple-time programmable memory which may be intentionally written to with different main data at different moments in time during operations of the associated device. In addition, some of the main memory may never be written to or utilized during operations of the associated device, or only written to once during operations of the associated device.

As also mentioned above, the one-time programmed cells are utilized to store data programmed by a manufacturer of the memory 16, a manufacturer of the memory system 10, a customer who implements the memory 16 in an associated device, or other appropriate entity. The data stored within one-time programmed memory may be referred to as one-time programmed data and the one-time programmed cells are programmed once with the one-time programmed data as discussed above. More specifically, the programming of the one-time programmed cells is permanent and irreversible in at least one embodiment and memory 16 is configured such that the one-time programmed data stored in the one-time programmed memory is permanently retained following programming. In one embodiment, some of the one-time programmed memory cells may never be written to or utilized.

Memory 16 may be implemented as one or more memory devices in example embodiments. For example, in one embodiment, the main memory cells and one-time programmed memory cells are the same type of memory cells (i.e., the main and one-time programmed memory cells have the same construction, such as the construction shown in FIG. 3).

In one embodiment, the main memory cells may be programmed using a first class of signals (e.g., signals which provide voltage potentials within a first range across electrodes of the memory cells) while the one-time programmed memory cells may be programmed using a second class of signals (e.g., signals which provide voltage potentials within a second range across electrodes of the memory cells). Accordingly, in one embodiment, a plurality of memory cells of a memory may be identified as main memory cells and the first class of signals are thereafter utilized to program the main memory cells and other memory cells of the memory may be identified as one-time programmed memory cells and the second class of signals are thereafter utilized to program the one-time programmed memory cells. In one embodiment discussed further below, the second class of signals apply increased voltage potentials across the electrodes of a memory cell compared with the first class of signals.

In one embodiment, the first class of signals may be applied to appropriate main memory cells to program the memory cells to different states at a plurality of moments in time and the main memory cells may be referred to as multiple-time programmable memory cells as mentioned above. However, in one embodiment, the application of the second class of signals to appropriate one-time programmed memory cells permanently and irreversibly programs the one-time programmed memory cells to one single state which permanently provides the one-time programmed memory cells in the single state.

In some implementations, a common memory structure (e.g., a common memory array) may be utilized as both main memory and one-time programmed memory. For example, one portion of the memory structure (e.g., one or more words or common bits of a plurality of words) may be utilized as one-time programmed memory and the remaining portion of the memory structure may be utilized as main memory. In another embodiment, one memory structure may be utilized as main memory and another memory structure may be utilized as one-time programmed memory. In an additional embodiment, one or more memory cells may initially be utilized as main memory and thereafter utilized as one-time programmed memory.

Figure 2:
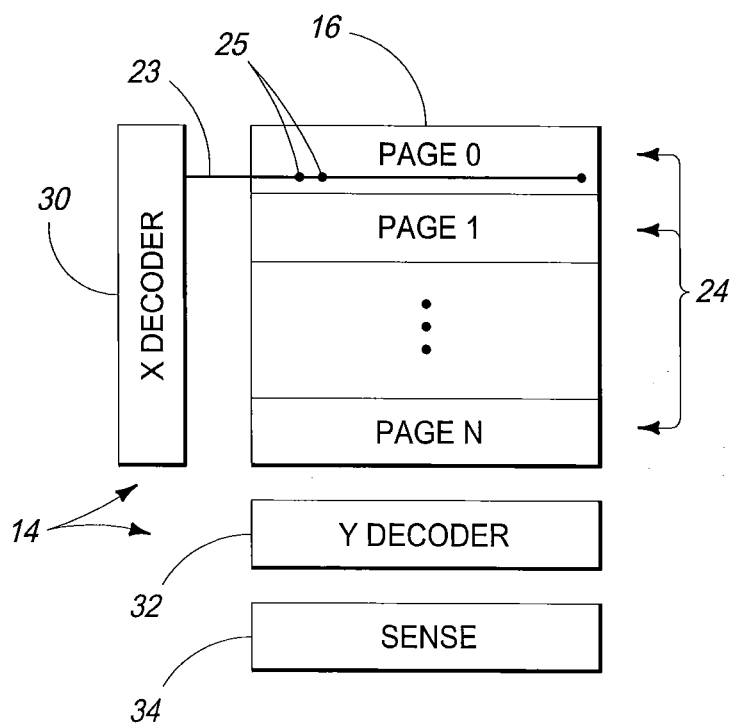
FIG. 2 is a functional block diagram of circuitry of the memory system according to one embodiment.

Referring to FIG. 2, details of one embodiment of access circuitry 14 and memory 16 are shown. In the illustrated embodiment, memory 16 is implemented as a memory structure having a single common memory array. In other embodiments (not shown), memory 16 may include a plurality of different memory structures or arrays which may be accessed by access circuitry 14. For example, one or more of the memory structures may be utilized as main memory and another of the structures may be utilized as one-time programmed memory.

The memory 16 is arranged as a plurality of pages 24 shown as Page 0-Page N in the illustrated embodiment. Although only Page 0 is shown as including a plurality of memory cells 25 (and word line 23), it is to be understood that all pages 24 may include respective word lines 23 and plural memory cells 25.

Some of the memory cells 25 may be utilized as main memory cells and others of the memory cells 25 may be utilized as one-time programmed cells. In some arrangements, a given page 24 may include both main cells and one-time programmed cells. In these arrangements, the one-time programmed cells may be addressed and accessed with the main cells of the respective page 24, for example by selection of a respective common word line 23. In other arrangements, a given page 24 may include only one of main cells or one-time programmed cells. As described in illustrative embodiments below, some cells may also change from being utilized as main cells to being utilized as one-time programmed cells.

In one embodiment, a single page 24 includes more main cells than one-time programmed cells. Main memory of an individual page 24 may include, depending upon the type of memory utilized, between 16-8000 main cells while the one-time programmed memory for the same page 24 may include between 1-8 one-time programmed cells in example embodiments. Different numbers of cells 25 may be provided within an individual page 24 in other embodiments.

Although the main and one-time programmed cells of a given page 24 may be accessed simultaneously in some embodiments described herein, only the main memory is available to the associated device for storage of data during user operations of the associated device, while the one-time programmed memory is reserved for one-time programmed data programmed by the manufacturer of the memory, manufacturer of the associated device, or end customer which implements the memory in the associated device or end product in one embodiment.

In the illustrated embodiment, access circuitry 14 is implemented as an X decoder 30, a Y decoder 32, and a sense amplifier 34. X and Y decoders 30, 32 and sense amplifier 34 operate to access desired pages 24 and cells 25 for reading, writing and verification of data within the memory cells 25. As described in one embodiment below, the X and Y decoders 30, 32 may apply signals in the form of electronic pulses to the memory 16 to implement writing, reading and verification operations.

As mentioned above, the memory 16 of the embodiment shown in FIG. 2 includes a plurality of pages 24 which correspond to a plurality of rows. In one embodiment, X decoder 30 may select one of the pages 24 for reading, writing and verification of the memory cells 25 of the selected page 24. More specifically, each of the pages 24 may have an associated word line 23 which may be selected by X decoder 30 to activate and enable reading, writing and verification of the memory cells 25 of the selected page 24. In one arrangement, Y decoder 32 determines which ones of the memory cells 25 receive programming, reading or verifying pulses, respectively. In one embodiment, the memory cells 25 of different pages 24 are arranged with respect to a plurality of columns which are addressable and selected by the Y decoder 32.

One-time programmed memory is written once with one-time programmed data as mentioned above. Thereafter, it is not utilized to store main data during operations of the associated device, but rather main data utilized and generated by operations of the associated device is stored in main memory.

In one more specific embodiment, assume the controller 12 is implementing a programming operation where the contents of a given page 24 of memory 16 (e.g., Page 1) are to be programmed during operations of the associated device in which the memory system 10 is utilized. The X decoder 30 operates to select the word line 23 of the selected page 24 to activate the memory cells 25 of the selected page 24. Following selection of the respective word line 23 for the desired page 24, controller 12 may control the application of one or more programming pulses to appropriate memory cells 25 of memory 16 using Y decoder 32 to program the desired memory cells 25.

In the described example embodiment where the memory 16 is implemented as RRAM, applying pulses of different voltage polarities and/or voltage potentials across terminals of a memory cell 25 changes the resistance of the memory cell 25 and the different resistances correspond to different memory states (e.g., 0s and 1s data). Thereafter, during a read operation, a read voltage may be provided across the terminals of the memory cell 25, and the sense amplifier 34 may read the resulting current to determine which of the different resistance states the memory cell 25 has been programmed to.

Figure 3:
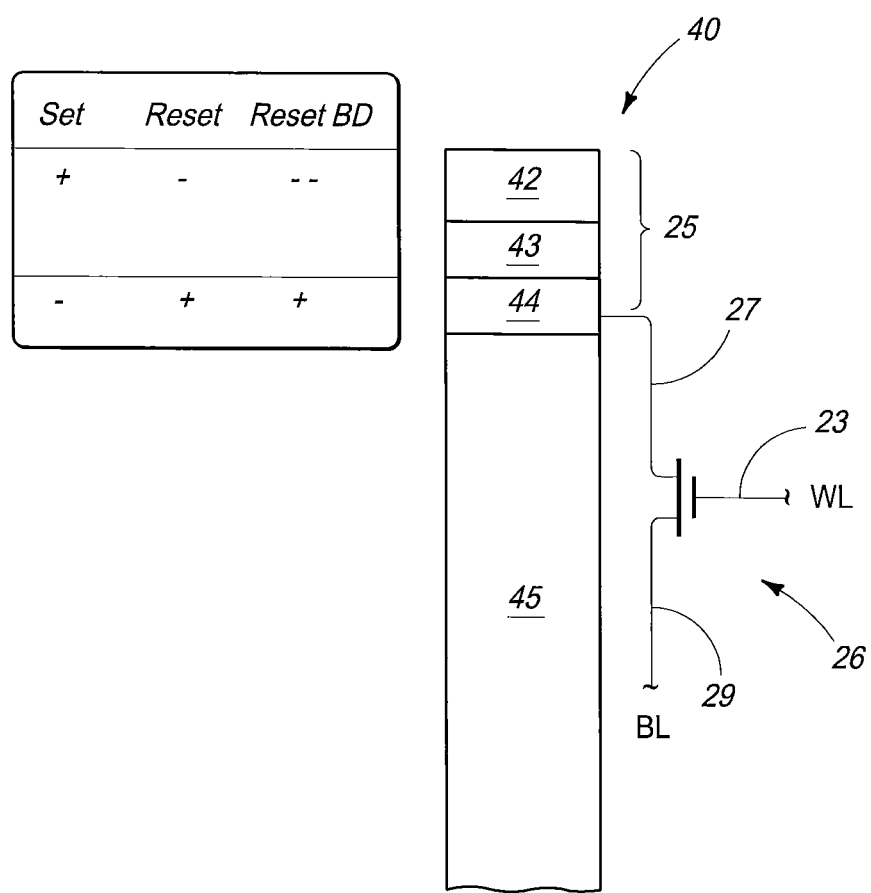
FIG. 3 is a cross-sectional view of a memory cell according to one embodiment.

Referring to FIG. 3, a fragment 40 of a construction of one of the memory cells 25 is shown coupled with example circuitry according to one embodiment. Other configurations of memory cells 25 and circuitry may be used in other embodiments.

Fragment 40 comprises a base 45 and a memory cell 25 over base 45 in the depicted embodiment. Base 45 may comprise semiconductor material, and in some embodiments may comprise, consist essentially of, or consist of monocrystalline silicon. Other configurations of base 45 are possible. Although only one memory cell 25 is shown in the depicted fragment 40, a plurality of additional similarly-configured memory cells 25 may be provided within a common structure or array. In one example, base 45 may be a monolithic substrate (e.g., semiconductive substrate) which supports a plurality of memory cells 25 of a common structure or array.

Memory cell 25 comprises a top electrode 42, a memory element 43 and a bottom electrode 44 in the illustrated embodiment. Top and bottom electrodes 42, 44 comprise electrically conductive material and may be referred to as terminals of the memory cell 25 in one embodiment. Top and bottom electrodes 42, 44 refer to different respective electrodes of the memory cell 25. The top and bottom electrodes 42, 44 of an individual memory cell may also be referred to as respective first and second electrodes, or vice-versa, in the following discussion.

As discussed above, memory cell 25 is a resistive random access memory (RRAM) cell in one embodiment, and accordingly, the memory element 43 is configured to have different electrical resistances corresponding to different memory states at different moments in time. In one illustrative example, appropriate voltage biases may be applied across top and bottom electrodes 42, 44 to change the resistance of the memory element 43. The application of different voltage biases across the memory element 43 may form or remove one or more metal filaments formed within memory element 43 and which cause associated changes in the resistance of the memory element 43 in these example embodiments. Other constructions of memory cell 25 are possible.

In one embodiment, in a program (set) state, memory element 43 of memory cell 25 has a relatively low electrical resistance, while in an erase (reset) state, memory element 43 of memory cell 25 has a relatively high electrical resistance. The low and high resistance states correspond to different values of digital information in one embodiment. The memory cell 25 may be programmed to the different resistance states at different moments in time.

As mentioned previously and described further below, different classes of programming signals or pulses may be utilized to program the memory cells 25 in one embodiment. For example, if a given memory cell 25 is to be utilized as a main memory cell, a first class of signals may be used to provide a first range of voltage potentials across the terminals of the memory cell 25 to program the memory cell 25 with different data at different moments in time. In this example, if another memory cell 25 is to be utilized as a one-time programmed memory cell, a second class of signals may be used to provide a second range of voltage potentials across the terminals of the another memory cell 25 to program the another memory cell 25. In one embodiment, the second class of signals provide voltages of increased potentials across the terminals of a given cell 25 compared with the first class of signals and operate to permanently and irreversibly program the memory cell 25 to a single state.

In addition, circuitry in the form of an access transistor 26 is shown coupled with the memory cell 25 in the example of FIG. 3. In this illustrated example, access transistor 26 is implemented as an NMOS field effect transistor (FET) with a gate coupled with wordline 23, a drain 27 connected with bottom electrode 44 of the memory cell 25 and a source 29 coupled with a bitline (i.e., the bitline may be coupled with a plurality of access transistors for memory cells of a given column of a memory array in one embodiment). The wordline 23 may be coupled with the gates of other access transistors for all bits in a row of the memory array in one embodiment. Current drivers (source/sink) may be connected to the top electrode 42 and the bitlines of the memory array in one configuration. In one embodiment, top electrode 42 is a common plate or electoral node shared by a plurality of other memory cells (not shown) of a common memory structure or array. In some embodiments, access transistor 26 may be configured as a PMOS field effect transistor to withstand increased voltage potentials (e.g., which may be present with the application of the second class of signals described herein).

The discussion proceeds with respect to example programming operations which may be performed with respect to the depicted memory cell 25. The discussion initially proceeds with example programming of the memory cell 25 operating as a main memory cell, accordingly, using the first class of signals discussed above. Thereafter, the discussion continues with example programming of the memory cell 25 operating as a one-time programmed memory cell using the second class of signals.

In one example for implementing a program (set) operation with respect to memory cell 25 operating as main memory, the top electrode 42 may be held at a relatively low voltage bias while transistor 26 is off (i.e., the gate is low). The bitline 29 may be set to a relatively low voltage bias corresponding to or the same as the bias of top electrode 42. The wordline 23 connected with gate 23 may be brought to a desired bias level to turn transistor 26 on, however, no current flows through memory cell 25 since the top and bottom electrodes 42, 44 are at substantially the same bias potential.

Thereafter, to perform the program (set) write operation, the voltage of the top electrode 42 may be increased to apply the desired voltage bias across the selected memory cell 25 for a given amount of time during which current flows through the memory cell 25 and provides the memory cell 25 in the desired program (set) resistance state. The amount of current flow between the electrodes 42, 44 may be determined by a number of factors including the total bias between the top electrode 42 and the bitline 29, the bias of the gate of access transistor 26, the resistance of the memory cell 25 and potentially the controller 12 and access circuitry 14. The application of this voltage bias causes one or more electrically conductive filaments to form within the memory element or component of the memory cell which reduces the electrical resistance of the memory element from a high resistance state to a low resistance state as described further below with respect to FIGS. 4-4B. After application of the pulse to implement the program (set) write operation, the wordline and gate 23 are biased low and the bitline bias returns to the bias of the top electrode 42. The order of transitioning of the wordline and bitline may vary for both the start and end of the pulse in different embodiments.

In an example for implementing an erase (reset) write operation of the memory cell 25, top electrode 42 is placed at a relatively low voltage bias and the voltage bias of the bitline may be increased above the bias of top electrode 42 to cause current to flow through the memory cell 25 to remove (e.g., dissolve) the electrical conductive filaments thereby increasing the electrical resistance of the memory cell 25 and programming the memory cell 25 to an erase (reset) state.

The discussion of the application of the pulses for implementing program (set) and erase (reset) write operations and the relative biasing applied to the memory cell 25 using the first class of signals is illustrative and other implementations are possible. More specifically, memory cell 25 is bipolar in the illustrated example embodiment and voltage biases may be selectively lowered or raised at each of the top electrode 42 and bitline to provide appropriate relative voltage biasing to implement write, read and verify operations.

Additionally, read and/or verify operations may be performed by applying different voltage biases to the top electrode 42 and bitline and measuring the amount of current flowing through the memory cell 25 which indicates the memory state of the memory cell 25 in one embodiment.

The first class of signals discussed above are applied to a memory cell 25 functioning as a main memory cell to selectively set and reset the memory cell at different moments in time. As mentioned above, a second class of signals may be applied to one or more one-time programmed memory cells to irreversibly and permanently program the memory cell(s).

More specifically, in one embodiment, the second class of signals may be utilized to permanently and irreversibly program a given memory cell to a single state providing the memory cell as a one-time programmed memory cell. In one embodiment, the second class of signals apply an increased voltage potential across the terminals of the memory cell 25 compared with the first class of signals. The application of the second class of signals permanently changes the physical structure of the memory cell 25 in one embodiment.

For example, the second class of signals may provide a reduced voltage to top electrode 42 compared with the first class of signals which are applied to the top electrode 42 during the reset programming of a memory cell 25 operating as main memory. The bottom electrode 44 may be held at substantially the same voltage bias as used during the reset programming of a main memory cell 25. The application of the reduced voltage to the top electrode 42 causes breakdown of electrically insulating dielectric material of the memory element of the memory cell 25 as described below with respect to the example embodiment of FIG. 4. In particular, material of the bottom electrode 44 may migrate into the electrically insulating dielectric material during the breakdown and which permanently provides the memory cell in a low resistance state corresponding to one memory state.

Accordingly, in one embodiment, a first class of signals may be applied to a given memory cell 25 which operates as a main memory cell to change the memory state of the memory cell 25 when desired corresponding to different data to be stored using the memory cell 25. At a subsequent moment in time, a second class of signals may be applied to the given memory cell 25 to permanently and irreversibly program the one-time programmed cell into a single state (e.g., low resistance state discussed above).

However, one-time programmed data may include a plurality of different states. Accordingly, in one embodiment, one or more one-time programmed memory cells may be provided in a state other than the single state which results from application of the second class of programming signals discussed above. For example, the application of the second class of signals provides the memory cells in a low resistance state as discussed above in one implementation. However, it may be desirable to have one or more of the one-time programmed memory cells in a high resistance state.

The memory cells 25 discussed above with respect to FIG. 3 are originally provided in a high resistance native state and the application of the second class of signals permanently configures the memory cells receiving the second class of signals in the low resistance state. In one embodiment, some of the one-time programmed memory cells may be identified to store data corresponding to a high resistance state. These one-time programmed memory cells are not programmed with the second class of signals but rather may either be unprogrammed (i.e., remaining with their native high resistance) or programmed to a high resistance state using the first class of signals. These identified high resistance one-time programmed memory cells may be flagged or identified to not be programmed in subsequent operations, and such cells thereafter retain the high resistance one-time programmed data in one embodiment.

FIG. 3 includes a map illustrating the voltages which are applied to the electrodes 42, 44 to implement a set operation to form an electrically conductive member, implement a reset operation to remove the formed electrically conductive member, and implement a reset breakdown operation to break down the dielectric material and form a permanent and irreversible electrically conductive member.

Figure 4:
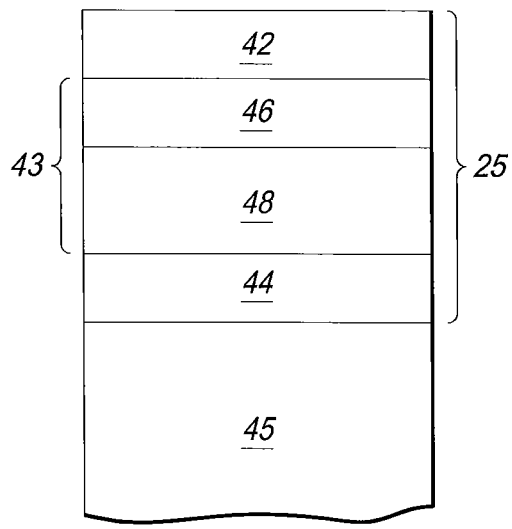
FIGS. 4-4B are cross-sectional views of a memory cell in different memory states according to one embodiment.
Figure 4A:
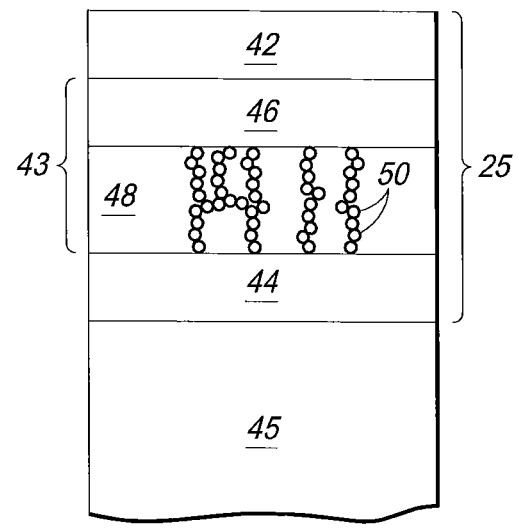
Figure 4B:
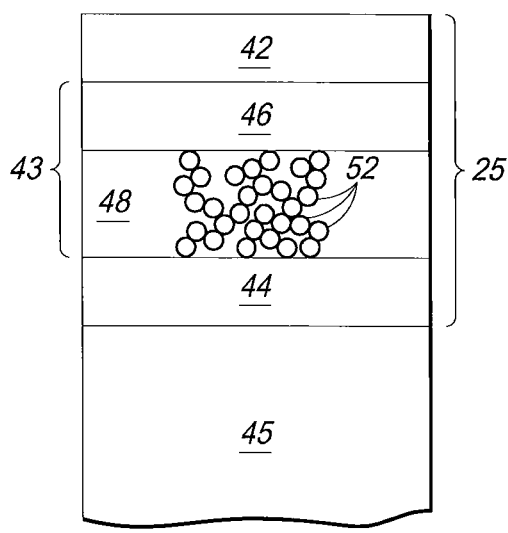

Referring to FIGS. 4-4B, additional details regarding programming of a memory cell 25 are described according to one embodiment. As discussed above, an example memory cell 25 includes top electrode 42, memory element 43 and a bottom electrode 44. Top and bottom electrodes 42, 44 comprise electrically conductive material and may be referred to as terminals of the memory cell 25 in one embodiment.

The illustrated embodiment of memory element 43 includes an electrically conductive source member or layer 46 and a dielectric layer 48 intermediate the electrodes 42, 44. In one embodiment, the source layer 46 is a Cu+ source layer (e.g., CuTe), example materials of the dielectric layer 48 include AlOx, HfOx, and ZrOx, and the bottom electrode 44 is titanium nitride (TiN). Other embodiments are possible.

FIG. 4 illustrates a memory cell 25 in a high resistance state which may correspond to one of the memory states of the memory cell 25. In one embodiment, the memory cell 25 may have the high resistance state in a native state following fabrication of the memory cell 25 and prior to any programming of the memory cell 25.

Referring to FIG. 4A, a set programming operation has been performed by the application of the first class of signals including a voltage bias to the top electrode 42 which is more positive than the voltage bias applied to the bottom electrode 44. In one more specific example, a voltage bias of approximately 1-5V is applied to the top electrode 42 while the bottom electrode 44 is provided at 0V to implement the set operation. The application of these signals causes the formation of one or more electrically conductive structures 50 (e.g., filaments) through dielectric layer 48 and between source layer 46 and bottom electrode 44. The formation of the structures 50 provides the memory cell 25 in a low resistance state. In one embodiment, the structures 50 comprise material (e.g., copper) from the source layer 46.

A memory cell 25 having the conductive structures 50 may be programmed in a reset operation to a high resistance state by the application of the first class of signals including a voltage bias to the bottom electrode 44 which is more positive than the voltage bias applied to the top electrode 42. In one more specific example, a voltage bias of approximately 1-5V is applied to the bottom electrode 44 while the top electrode 42 is provided at 0V to implement the reset operation. The application of these signals dissolves any electrically conductive structures 50 within dielectric layer 48, thereby increasing the electrical resistance of the memory element 43 between the electrodes 42, 44 and providing the memory cell 25 in a high resistance state.

Accordingly, in one embodiment, the first class of signals apply different voltage polarities to a memory cell 25 to program the memory cell 25. As discussed in the illustrative embodiment above, the first class of signals provide top electrode 42 at a positive voltage bias compared with the bottom electrode 44 during a set operation and the first class of signals provide bottom electrode 44 at a positive voltage bias compared with the top electrode 42 during a reset operation.

A memory cell 25 being utilized as a main memory cell may be repeatedly configured between the arrangements of FIGS. 4 and 4A at different moments in time to store main data.

Referring to FIG. 4B, the memory cell 25 has been permanently programmed to a low resistance state for the storage of one-time programmed data. In particular, the second class of signals including a negative voltage bias is applied to the top electrode 42 and a positive voltage bias is applied to the bottom electrode 44 to implement a reset breakdown programming operation of the memory cell 25. In one embodiment, the second class of signals provide an increased voltage potential across the electrodes 42, 44 of the memory cell 25 compared with the first class of signals utilized to provide a reset operation of the memory cell 25. In one more specific example, a voltage bias of approximately 2-7V is applied to the bottom electrode 44 while the top electrode 42 is provided at 0V to implement the reset breakdown operation.

The application of the increased voltage potential across the electrodes 42, 44 breaks down the dielectric layer 48 and forms one or more stable electrically conductive structures 52 (e.g., filaments) of material (e.g., TiN) from bottom electrode 44 through the dielectric layer 48 in one embodiment. In one embodiment, the electrically conductive structures 52 lower the electrical resistance of memory element 43 and provide the memory cell 25 in a reduced low resistance state. The one or more electrically conductive structures 52 may be referred to as an anti-fuse in one embodiment.

As mentioned previously, the application of the second class of signals to the memory cell 25 irreversibly and permanently forms the highly reliable and stable structures 52 thereby irreversibly and permanently programming the memory cell 25 into one of the memory states (e.g., low resistance state) in one embodiment. Thereafter, read operations against the memory cell 25 of FIG. 4B will result in increased electrical current compared with the reading of a memory cell 25 shown in FIG. 4 and which indicates the reduced resistance memory state of the memory cell 25.

A memory cell 25 programmed and configured as shown in FIG. 4B may be referred to as a one-time programmed memory cell inasmuch as the memory cell is permanently and irreversibly programmed into a low resistance state. As mentioned above, other memory cells may be identified as corresponding to one-time programmed data of a high resistance state and such cells may be left in a native (e.g., high resistive) state or otherwise programmed to a high resistance state and thereafter not subsequently programmed such that the cells thereafter permanently maintain or retain the one-time programmed data of the high resistance state.

The memory cells 25 may be configured in different modes depending upon whether they are utilized as main memory or one-time programmed memory in one embodiment. For example, memory cells 25 utilized as main memory may be configured in a first mode where the application of the first class of signals to the memory cells selectively changes the states of the memory cells between the high resistance state of FIG. 4 or the low resistance state of FIG. 4A at different moments in time. Memory cells 25 utilized as one-time programmed memory may be configured in a second mode where the application of the second class of signals to the memory cells 25 irreversibly and permanently programs the memory cells into the low resistance state of FIG. 4B.

Figure 5:
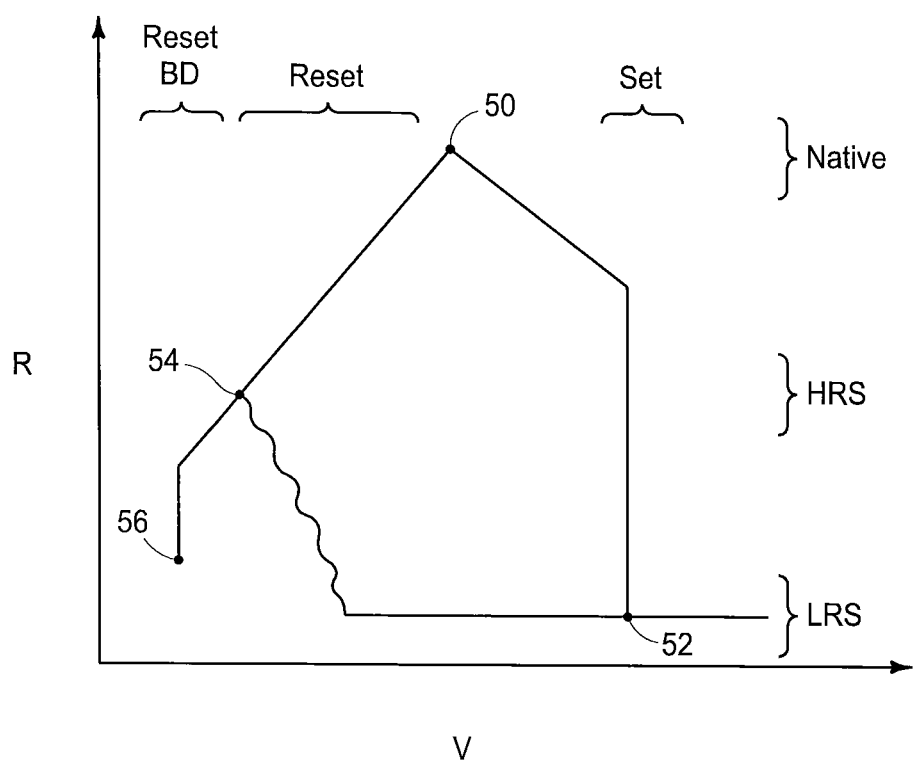
FIG. 5 is a graph of electrical resistance of a memory cell as a result of voltages applied across the memory cell according to one embodiment.

Referring to FIG. 5, a memory cell is initially provided in a high resistance state (HRS) shown as point 50 on the illustrated graph prior to programming and having a resistance corresponding to $R_{native}$ in one embodiment. The application of a positive voltage bias to the plate of the memory cell during a set operation causes the formation of a Cu filament through the dielectric of the memory cell which provides the memory cell in a low resistance state (LRS) shown at point 52. The application of a negative voltage bias to the plate of the memory cell during a reset operation drives out and/or dissolves the Cu filament which provides the memory cell in the high resistance state (HRS) shown at point 54. The application of an increased negative voltage bias to the plate of the memory cell causes the dielectric of the memory cell to break down and forms a permanent and irreversible TiN filament through the dielectric of the memory cell which permanently provides the memory cell in the low resistance state (LRS) shown at point 56. A memory cell may be provided in the permanent LRS state at point 56 directly from point 50 without a set operation or following set and reset operations in different embodiments.

CONCLUSION

In some embodiments, a memory cell comprises a plurality of electrodes; a memory element comprising dielectric material intermediate the electrodes; wherein a first electrically conductive structure is formed within the dielectric material providing the memory element in a low resistance state corresponding to a first of a plurality of different memory states as a result of a first voltage of a first polarity being applied across the electrodes; wherein the first electrically conductive structure is removed from the dielectric material providing the memory element in a high resistance state corresponding to a second memory state as a result of a second voltage of a second polarity, which is opposite to the first polarity, being applied across the electrodes; and wherein a permanent and irreversible electrically conductive structure is formed within the dielectric material providing the memory element in the low resistance state as a result of a third voltage of the second polarity and having an increased potential compared with the second voltage being applied across the electrodes.

In some embodiments, a memory system comprises a memory array comprising a plurality of memory cells individually configured to have a plurality of different resistance states corresponding to different memory states of the respective individual memory cell; and access circuitry configured to apply a first voltage having a first polarity to a plurality of the memory cells to form first electrically conductive structures within dielectric material of the memory cells providing the memory cells in a low resistance state, to apply a second voltage having a second polarity, which is opposite to the first polarity, to the memory cells to remove the first electrically conductive structures providing the memory cells in a high resistance state, and to apply a third voltage having the second polarity, and an increased voltage potential compared with the second voltage, to at least one of the memory cells to form a permanent and irreversible electrically conductive structure within dielectric material of the at least one memory cell providing the at least one memory cell in the low resistance state.

In some embodiments, a memory system comprises a plurality of memory cells individually comprising a memory element comprising dielectric material intermediate a plurality of electrodes, and the memory elements are individually configured to have different electrical resistances corresponding to different memory states of the respective individual memory cell; wherein at least one electrically conductive structure is within the dielectric material of some of the memory cells to provide the memory elements of the some memory cells individually having a decreased electrical resistance at one of a plurality of different moments in time and the memory elements of the some memory cells are void of the at least one electrically conductive structure to provide the memory elements of the some memory cells individually having an increased electrical resistance at another of the different moments in time; and wherein the dielectric material of at least one of the memory cells is in a permanently broken down state permanently providing the memory element of the at least one memory cell with the decreased electrical resistance.

In some embodiments, a memory cell programming method comprises first applying a voltage having a first polarity across a memory element of a memory cell, the first applying forming a first electrically conductive structure within dielectric material of the memory element providing the memory cell in a low resistance state corresponding to a first of a plurality of different memory states; after the first applying, second applying a voltage having a second polarity, which is opposite to the first polarity, across the memory element, the second applying removing the first electrically conductive structure providing the memory cell in a high resistance state corresponding to a second memory state; after the second applying, third applying a voltage having the second polarity across the memory element, the third applying forming a permanent and irreversible electrically conductive structure within the dielectric material providing the memory cell in the low resistance state; and wherein the voltage of the third applying has an increased voltage potential compared with the voltage of the second applying.

In some embodiments, a memory array programming method comprises first applying a voltage having a first polarity across a plurality of first memory cells of a memory array, the first applying forming electrically conductive structures within dielectric material of the first memory cells providing the first memory cells in a low resistance state corresponding to a first of a plurality of different memory states; after the first applying, second applying a voltage having a second polarity, which is opposite to the first polarity, across the first memory cells, the second applying removing the electrically conductive structures providing the first memory cells in a high resistance state corresponding to a second memory state; third applying a voltage having the second polarity across a second memory cell of the memory array, the third applying forming a permanent and irreversible electrically conductive structure within dielectric material of the second memory cell providing the second memory cell in the low resistance state corresponding to the first memory state; and wherein the voltage of the third applying has an increased voltage potential compared with the voltage of the second applying.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
a plurality of electrodes;
a memory element comprising dielectric material intermediate the electrodes;
wherein a first electrically conductive structure is formed within the dielectric material providing the memory element in a low resistance state corresponding to a first of a plurality of different memory states as a result of a first voltage of a first polarity being applied across the electrodes;
wherein the first electrically conductive structure is removed from the dielectric material providing the memory element in a high resistance state corresponding to a second memory state as a result of a second voltage of a second polarity, which is opposite to the first polarity, being applied across the electrodes; and
wherein a permanent and irreversible electrically conductive structure is formed within the dielectric material providing the memory element in the low resistance state as a result of a third voltage of the second polarity, and having an increased potential compared with the second voltage, being applied across the electrodes.

2. The memory cell of claim 1 wherein the memory cell is a conductive bridge RAM cell.

3. The memory cell of claim 1 wherein the potential of the third voltage is sufficient to break down the dielectric material.

4. The memory cell of claim 1 further comprising an electrically conductive source member adjacent to a first of the electrodes, and wherein the first electrically conductive structure comprises material of the source member.

5. The memory cell of claim 4 wherein the permanent and irreversible electrically conductive structure comprises material of a second of the electrodes.

6. A memory system comprising:
a memory array comprising a plurality of memory cells individually configured to have a plurality of different electrical resistance states corresponding to different memory states of the respective individual memory cell; and
access circuitry configured to apply a first voltage having a first polarity to a plurality of the memory cells to form first electrically conductive structures within dielectric material of the memory cells providing the memory cells in a low resistance state, to apply a second voltage having a second polarity, which is opposite to the first polarity, to the memory cells to remove the first electrically conductive structures providing the memory cells in a high resistance state, and to apply a third voltage having the second polarity, and an increased voltage potential compared with the second voltage, to at least one of the memory cells to form a permanent and irreversible electrically conductive structure within dielectric material of the at least one memory cell providing the at least one memory cell in the low resistance state.

7. The memory system of claim 6 wherein the memory cells have the same construction.

8. The memory system of claim 6 wherein the memory cells are conductive bridge RAM cells.

9. The memory system of claim 6 wherein the potential of the third voltage is sufficient to break down the dielectric material of the at least one memory cell.

10. The memory system of claim 6 wherein the memory cells are provided in a high resistance state prior to any programming of the memory cells, and wherein another of the memory cells is permanently maintained in the high resistance state.

11. The memory system of claim 6 further comprising an electrically conductive common plate, and wherein one of the electrodes of the memory cells is the electrically conductive common plate.

12. The memory system of claim 6 further comprising a monolithic substrate which supports the memory cells.

13. The memory system of claim 6 further comprising an electrically conductive source layer adjacent to first electrodes of the memory cells, and wherein the first electrically conductive structures comprise material of the source layer.

14. The memory system of claim 13 wherein the permanent and irreversible electrically conductive structure comprises material of a second electrode of the at least one memory cell.

15. A memory system comprising:
a plurality of memory cells individually comprising a memory element comprising dielectric material intermediate a plurality of electrodes, and the memory elements are individually configured to have different electrical resistances corresponding to different memory states of the respective individual memory cell;
wherein at least one electrically conductive structure is within the dielectric material of each of some of the memory cells to provide the memory elements of the some memory cells individually having a decreased electrical resistance at one of a plurality of different moments in time and the memory elements of the some memory cells are void of the at least one electrically conductive structure to provide the memory elements of the some memory cells individually having an increased electrical resistance at another of the different moments in time; and
wherein the dielectric material of at least one of the memory cells is in a permanently broken down state permanently providing the memory element of the at least one memory cell with the decreased electrical resistance.

16. The memory system of claim 15 wherein the memory cells have the same construction.

17. The memory system of claim 15 wherein the memory cells are conductive bridge RAM cells.

18. The memory system of claim 15 further comprising access circuitry configured to apply a first voltage having a first polarity to the some memory cells to form the electrically conductive structures, to apply a second voltage having a second polarity, which is opposite to the first polarity, to the some memory cells to remove the electrically conductive structures, and to apply a third voltage having the second polarity, and an increased voltage potential compared with the second voltage, to the at least one memory cell to break down the dielectric material of the at least one memory cell.

19. The memory system of claim 15 wherein the memory elements of the memory cells individually have the increased electrical resistance prior to any programming of the memory cells, and wherein another of the memory cells permanently has the increased electrical resistance.

20. The memory system of claim 15 wherein the some and at least one memory cells comprise memory cells of an array which comprises an electrically conductive plate, and wherein one of the electrodes of the some and the at least one memory cells is the electrically conductive plate.

21. The memory system of claim 15 wherein the electrically conductive structures of the some memory cells individually comprise electrically conductive material from electrically conductive source members of the some memory cells and the dielectric material of the at least one memory cell comprises electrically conductive material from one of the electrodes of the at least one memory cell.

22. A memory cell programming method comprising:
first applying a voltage having a first polarity across a memory element of a memory cell, the first applying forming a first electrically conductive structure within dielectric material of the memory element providing the memory cell in a low resistance state corresponding to a first of a plurality of different memory states;
after the first applying, second applying a voltage having a second polarity, which is opposite to the first polarity, across the memory element, the second applying removing the first electrically conductive structure providing the memory cell in a high resistance state corresponding to a second memory state;
after the second applying, third applying a voltage having the second polarity across the memory element, the third applying forming a permanent and irreversible electrically conductive structure within the dielectric material providing the memory cell in the low resistance state; and
wherein the voltage of the third applying has an increased potential compared with the voltage of the second applying.

23. The method of claim 22 wherein the memory cell is a conductive bridge RAM cell.

24. The method of claim 22 wherein the third applying breaks down the dielectric material of the memory cell.

25. The method of claim 22 wherein the first applying forms the first electrically conductive structure comprising material from a source member adjacent to one of a plurality of electrodes of the memory cell.

26. The method of claim 25 wherein the third applying forms the permanent and irreversible electrically conductive structure from material of another of the electrodes.

27. A memory array programming method comprising:
first applying a voltage having a first polarity across a plurality of first memory cells of a memory array, the first applying forming electrically conductive structures within dielectric material of the first memory cells providing the first memory cells in a low resistance state corresponding to a first of a plurality of different memory states;
after the first applying, second applying a voltage having a second polarity, which is opposite to the first polarity, across the first memory cells, the second applying removing the electrically conductive structures providing the first memory cells in a high resistance state corresponding to a second memory state;
third applying a voltage having the second polarity across a second memory cell of the memory array, the third applying forming a permanent and irreversible electrically conductive structure within dielectric material of the second memory cell providing the second memory cell in the low resistance state corresponding to the first memory state; and
wherein the voltage of the third applying has an increased potential compared with the voltage of the second applying.

28. The method of claim 27 wherein the first and second memory cells are conductive bridge RAM cells.

29. The method of claim 27 wherein the third applying breaks down the dielectric material of the second memory cell.

30. The method of claim 27 further comprising providing the memory array comprising a monolithic substrate.

31. The method of claim 27 further comprising providing the memory array wherein the memory cells have the same construction.

32. The method of claim 27 wherein the first applying forms the first electrically conductive structures comprising material from a source layer adjacent to one of a plurality of electrodes of the memory cells.

33. The method of claim 32 wherein the third applying forms the permanent and irreversible electrically conductive structure from material of another of the electrodes of the memory cells.

34. The memory system of claim 15 wherein a permanent and irreversible electrically conductive structure is present within the dielectric material of the at least one memory cell in the permanently broken down state.

35. The memory cell of claim 1 wherein an entirety of a length of the first electrically conductive structure between the electrodes is surrounded by the dielectric material and an entirety of a length of the permanent and irreversible electrically conductive structure between the electrodes is surrounded by the dielectric material.

36. The memory cell of claim 35 wherein the first electrically conductive structure contacts the electrodes and the permanent and irreversible electrically conductive structure contacts the electrodes.

37. The memory system of claim 6 wherein the memory cells having the first electrically conductive structures within the dielectric material of the memory cells and the at least one memory cell have the same structure.

38. The memory system of claim 15 wherein the some memory cells and the at least one memory cell have the same structure.

* * * * *